United States Patent
Koh

(10) Patent No.: US 6,842,128 B2
(45) Date of Patent: Jan. 11, 2005

(54) HIGHER ORDER SIGMA-DELTA ANALOG-TO-DIGITAL CONVERTER BASED ON FINITE IMPULSE RESPONSE FILTER

(75) Inventor: Jinseok Koh, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/376,441

(22) Filed: Feb. 28, 2003

(65) Prior Publication Data

US 2004/0169596 A1 Sep. 2, 2004

(51) Int. Cl.[7] .................................................. H03M 3/00
(52) U.S. Cl. ........................ 341/143; 341/155; 341/61
(58) Field of Search ................................ 341/143, 155, 341/61, 141, 118, 56, 150, 76, 122; 375/220, 242, 247

(56) References Cited

U.S. PATENT DOCUMENTS

| | | | | |
|---|---|---|---|---|
| 5,191,334 A | * | 3/1993 | Yasuda | 341/61 |
| 6,408,031 B1 | * | 6/2002 | Hendricks | 341/143 |
| 6,518,904 B1 | * | 2/2003 | Jelonnek | 341/143 |
| 6,577,259 B1 | * | 6/2003 | Jelonnek | 341/143 |

* cited by examiner

*Primary Examiner*—Michael Tokar
*Assistant Examiner*—Lam T. Mai
(74) *Attorney, Agent, or Firm*—Frederick J. Telecky, Jr.; W. James Brady, III

(57) ABSTRACT

A sigma-delta ADC includes a higher order infinite impulse response (IIR) filter based on a finite impulse response (FIR) filter and possesses the same functionality as a conventional sigma-delta ADC in terms of noise and swings at the output of the analog integrators. The higher order sigma-delta ADC requires only one analog amplifier however, even though it has a higher order analog integration function.

7 Claims, 4 Drawing Sheets

US 6,842,128 B2

HIGHER ORDER SIGMA-DELTA ANALOG-TO-DIGITAL CONVERTER BASED ON FINITE IMPULSE RESPONSE FILTER

BACKGROUND OF THE INVENTION

1. Field of the Invention

This invention relates generally to analog-to-digital converters. More particularly, this invention relates to an analog-to-digital converter (ADC) architecture based on a finite impulse response (FIR) filter.

2. Description of the Prior Art

Modern communication and mixed signal applications require high resolution ADCs. The sigma-delta ADC has been a best candidate in data acquisition, voice CODEC and receiver paths in communications channels, since a sigma-delta ADC offers many advantages such as lower power consumption, smaller silicon area requirements, and very good immunity with respect to process non-idealities. Present hand-held applications, however, such as cellular phones, desperately require very small power consumption due to the limited battery life. The primary current consuming building block and key building block in the sigma-delta ADC is an analog amplifier. In order to make a higher speed amplifier, more current consumption and more silicon area are required.

Several rules must be considered when designing a higher order sigma-delta ADC. The order of the noise transfer function is determined by the order of the integrator, for example; and each integrator requires one amplifier. The order of the sigma-delta ADC therefore indicates the minimum number of required amplifiers.

In view of the foregoing, it is both advantageous and desirable to provide a higher order sigma-delta ADC architecture that does not require one amplifier per integrator, thereby requiring less power consumption and less silicon area.

SUMMARY OF THE INVENTION

The present invention is directed to a sigma-delta A/D Converter that includes a higher order infinite impulse response (IIR) filter based on a finite impulse response (FIR) filter. The higher order sigma-delta ADC possesses the same functionality as a conventional sigma-delta ADC in terms of noise and swings at the output of the analog integrators, but requires only one analog amplifier however, even though it has a higher order analog integration function.

According to one embodiment, a sigma-delta analog-to-digital converter (ADC) comprises an infinite impulse response (IIR) filter having no more than one analog amplifier and further having an order greater than one and operational to generate a plurality of output signals; a digital filter operational to filter out up-converted frequency quantization noise associated with at least one IIR filter output signal and generate a low frequency feedback signal therefrom; and no more than one summing node, wherein the single summing node operates to sum the plurality of output signals and the low frequency feedback signal.

According to another embodiment, a method of analog-to-digital conversion comprises the steps of providing a sigma-delta analog-to-digital converter (ADC) having no less than a second order infinite impulse response (IIR) filter and possessing no more than one analog amplifier; and converting an analog input signal to a digital signal to achieve a level of functionality substantially identical to a conventional sigma-delta ADC having more than one analog amplifier in terms of noise and swings at the output of the associated analog integrators.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
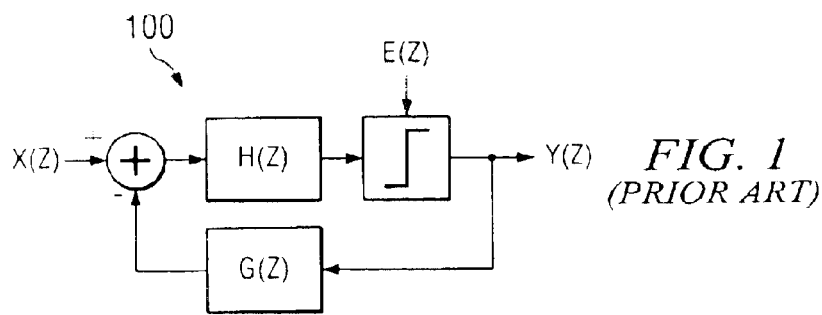
FIG. 1 is a simplified block diagram illustrating a basic single path sigma-delta ADC that is known in the art.

A general single path sigma-delta ADC architecture 100 common in the art is shown in FIG. 1. The H(z) function represents the ADC transfer function which is basically an analog building block; and G(z) represents the feedback transfer function which consists of digital building blocks.

In general, a comparator, assumed to be a white noise generator, is employed. With the white noise assumption, the comparator can be approximated as a linear building block whose noise, E(z), is generated by a quantization process. The noise transfer function (NTF) and signal transfer function (STF) associated with the ADC 100 can now be defined easily since all building blocks are linear.

Basically, the NTF is defined by the relationship between quantization noise, E(z), and the output signal, Y(z); and likewise, the STF is defined by the input, X(z), and the output, Y(z). The relationships can be represented as $$STF: \frac{Y(Z)}{X(Z)} = \frac{H(Z)}{1+H(Z)G(Z)}, \text{ and}$$

$$NTF: \frac{Y(Z)}{E(Z)} = \frac{H(Z)}{1+H(Z)G(Z)}.$$

In general, STF is an all pass filter function with delays, and NTF is a high pass filter function for low-pass sigma-delta ADC. In other word, sigma-delta ADC 100 compresses the quantization noise E(Z) in the lower frequency range and pushes that noise into the higher frequency range. The high frequency range noise is then usually filtered out going though the digital filters. Keeping in mind fundamental characteristics of sigma-delta ADCs, the topology described herein below with reference to the figures was developed by the present inventor considering objectives such as a simple implementation in silicon, and a smaller analog part. The embodiments described herein below then present a topology to implement transfer function H(z) in the analog domain, and its corresponding transfer function G(z) in the digital domain.

Figure 2A:
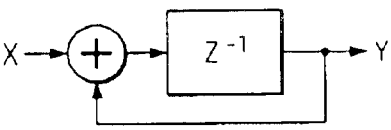
FIG. 2A is a simplified block diagram illustrating a basic discrete time integrator that is known in the art.
Figure 2B:
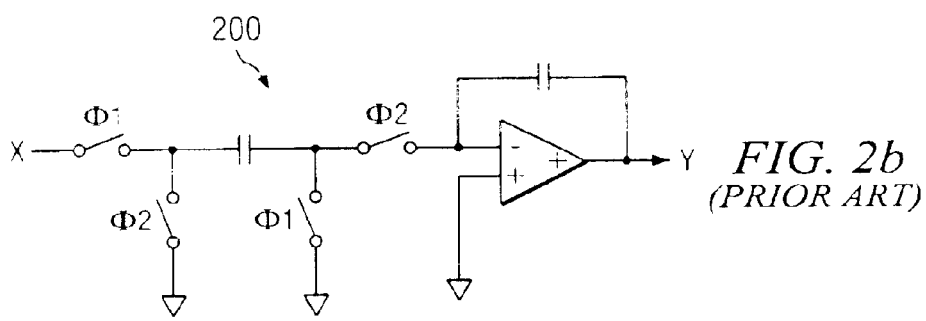
FIG. 2B is a simplified schematic diagram illustrating a switched capacitor implementation of the basic discrete time integrator shown in FIG. 2A that is known in the art.

FIG. 2A shows a basic discrete time integrator; while FIG. 2B shows its switched capacitor implementation 200. It can be appreciated that one analog amplifier 202 is required in order to realize a summing node.

Figure 3:
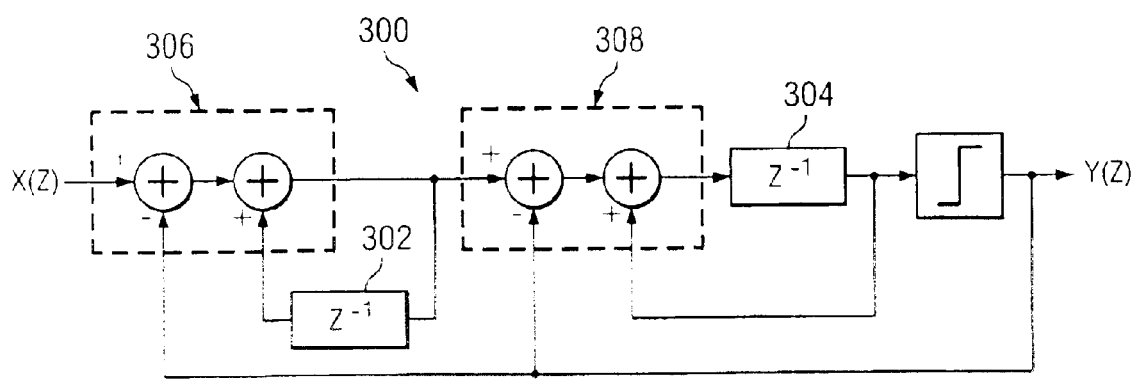
FIG. 3 is a simplified system diagram illustrating a conventional second order sigma-delta ADC that is known in the art.

FIG. 3 shows a second order conventional sigma-delta ADC 300. All integrator coefficients here are assumed to be unity for simplifying the mathematical manipulations. According to the above explanation of the transfer functions, the transfer function, G(z) is unity; and two discrete time integrators 302, 304 are used in the conventional second order sigma-delta ADC 300. As stated herein before, this implies at least two analog amplifiers should be used for this realization. In this regard, it is assumed at this time that the order of sigma-delta ADC and the number of amplifiers has one to one ratio relationship.

The inventive architecture described herein below with reference to the preferred embodiments, departs from the general relationship between number of amplifiers and the order of sigma-delta ADC by employing a proper infinite impulse response (IIR) filter structure for transfer function H(z) shown in FIG. 1. The requisite higher order FIR filter is achieved via switched capacitor circuits using a single amplifier. The associated delay elements and filter coefficients can then be realized simply by manipulating capacitor sizes and multi-phase control clock signals.

Figure 4A:
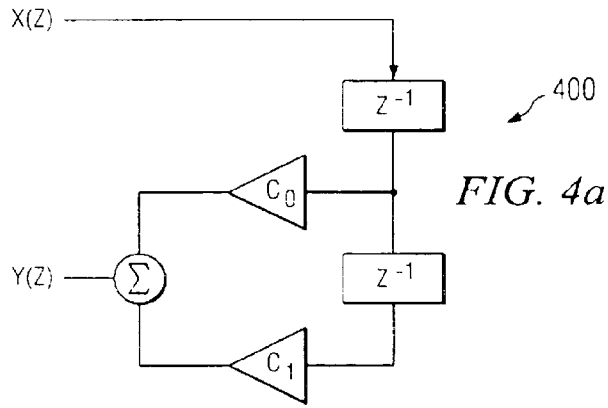
FIG. 4A is a block diagram illustrating a FIR filter.
Figure 4B:
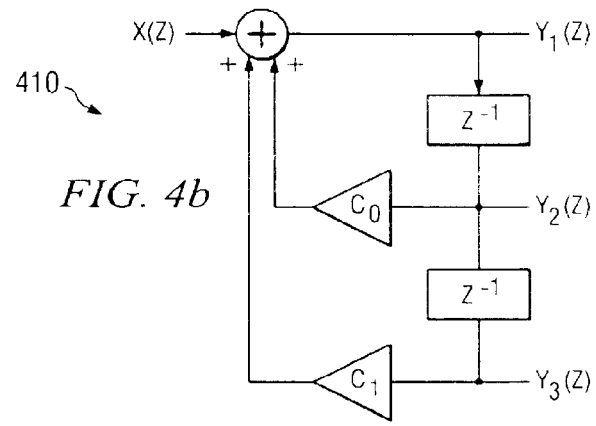
FIG. 4B is a block diagram illustrating an IIR filter having a single summing node and that is derived from the FIR filter structure shown in FIG. 4A.

FIG. 4A shows one example of an FIR filter block diagram 400; while FIG. 4B shows a second order IIR 410 filter derived from its FIR filter structure 400. The present invention is not so limited however, and it shall be understood that while FIG. 4B only shows the second order IIR function, it can be easily extended to higher orders simply by adding extra delay elements. Importantly, the IIR filter 410 and FIR filter 400 do not have mathematical conversion rules. Both filters 400, 410 have only structural similarities.

The output Y(Z) in FIG. 4A can be represented as $$Y(Z)=X(Z)(C_0 Z^{-1}+C_1 Z^{-2}).$$

The Y(Z) outputs shown in FIG. 4B are related to the common input X(Z) via relationships represented as $$\frac{Y_1(Z)}{X(Z)} = \frac{1}{1-C_0 Z^{-1}-C_1 Z^{-2}},$$

$$\frac{Y_2(Z)}{X(Z)} = \frac{Z^{-1}}{1-C_0 Z^{-1}-C_1 Z^{-2}}, \text{ and}$$

$$\frac{Y_3(Z)}{X(Z)} = \frac{Z^{-2}}{1-C_0 Z^{-1}-C_1 Z^{-2}}.$$

Figure 5:
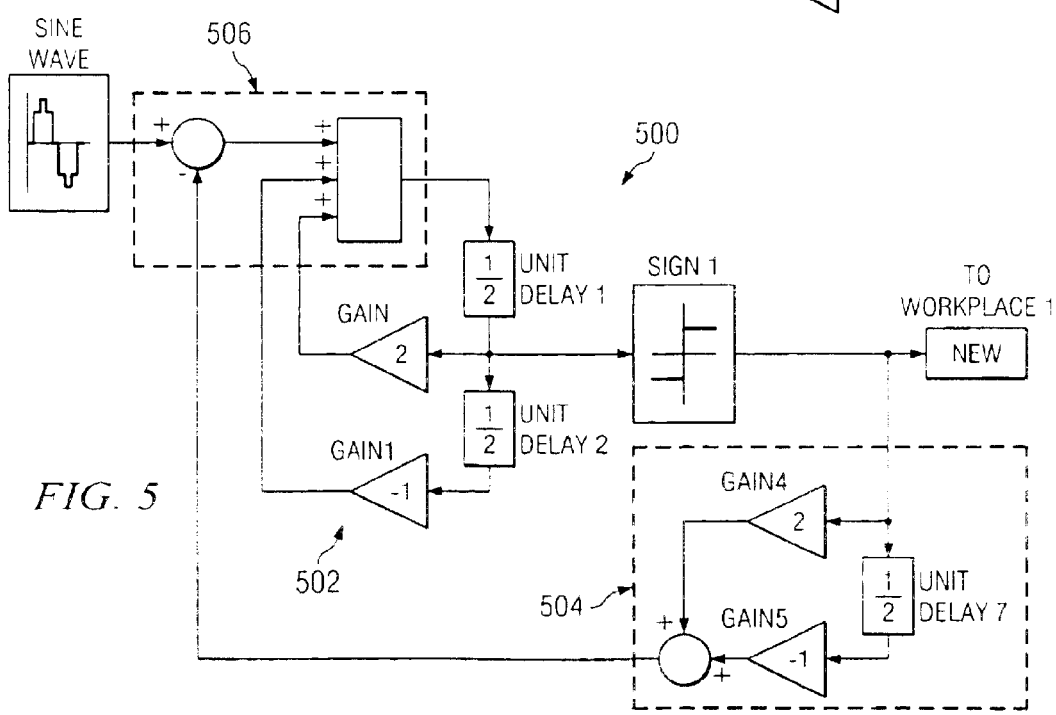
FIG. 5 is a block diagram showing a second order sigma-delta ADC developed using the second order IIR filter shown in FIG. 4B along with its corresponding digital filter.

Using the IIR structure 410 described herein, a second order sigma-delta ADC 500, shown in FIG. 5, was implemented by the present inventor using conventional MATLAB tools. The coefficients for the analog integrator 502 and digital 504 building blocks were calculated with simulation results shown in FIGS. 6–8. Looking again at FIG. 3, it can be seen that the conventional second-order sigma-delta ADC 300 has two analog summing nodes 306, 308. The second order sigma-delta ADC 500 implemented via a second order IIR filter 502 and its corresponding digital filter 504 however, can be seen to require only a single summing node 506.

Figure 6:
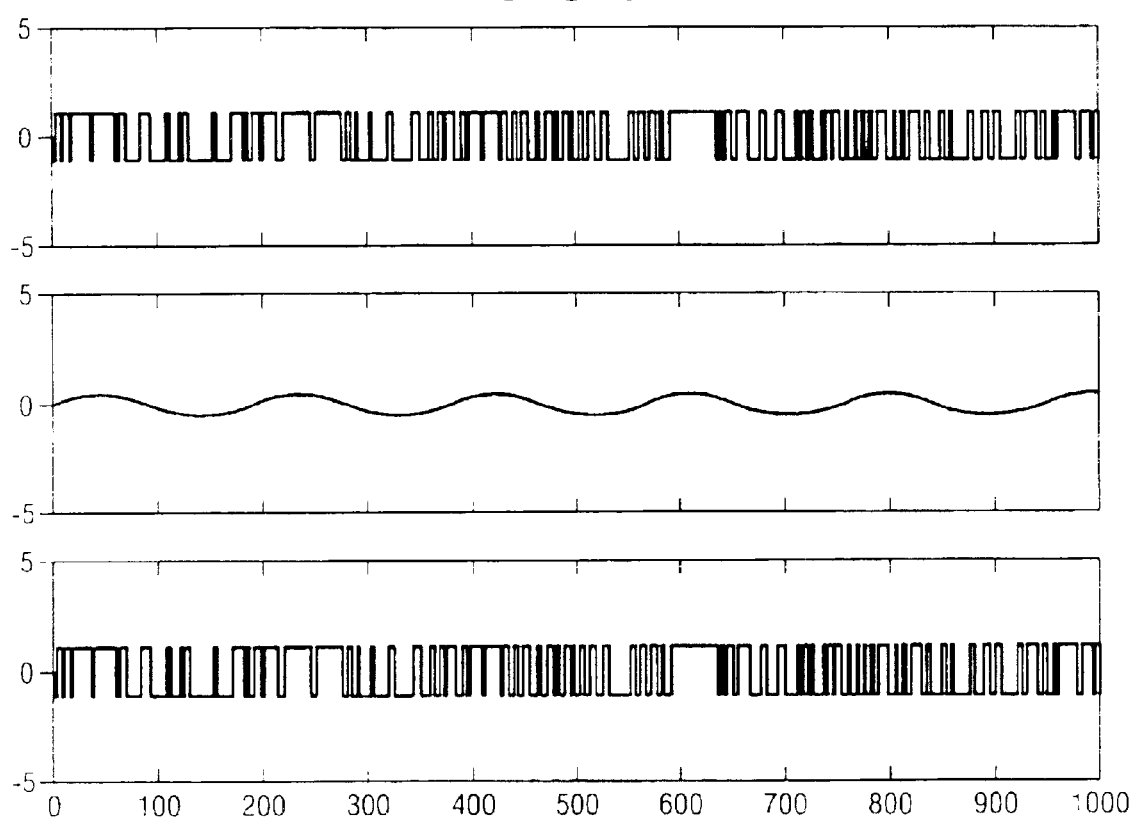
FIG. 6 shows time domain simulations associated with a conventional second order sigma-delta ADC as well as a second order sigma-delta ADC that was developed using the second order IIR filter shown in FIG. 4B and its corresponding digital filter.

FIG. 6 shows time domain simulations associated with a conventional second order sigma-delta ADC 300 as well as the second order sigma-delta ADC 500 that was developed using a second order IIR filter and its corresponding digital filter. The top plot shows the output of the conventional sigma-delta ADC. The middle plot shows the input signal common to both ADCs 300, 500. The bottom plot shows the output of the second order sigma-delta ADC 500.

Figure 7:
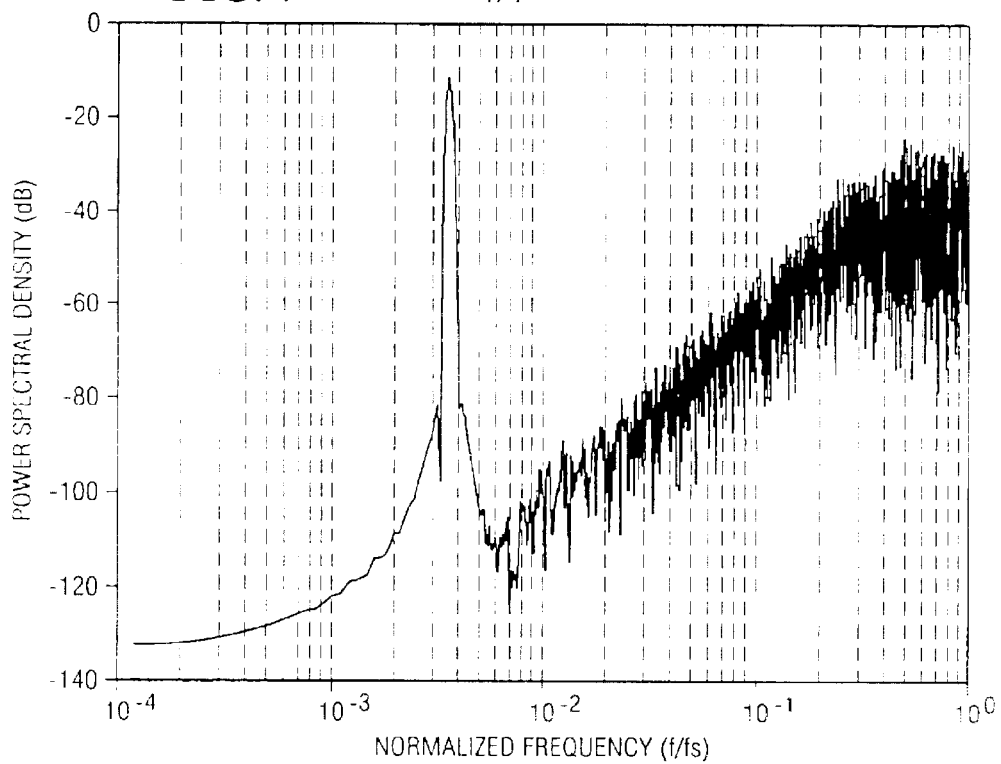
FIG. 7 is a power spectrum density plot associated with the conventional second order sigma-delta ADC shown in FIG. 3.
Figure 8:
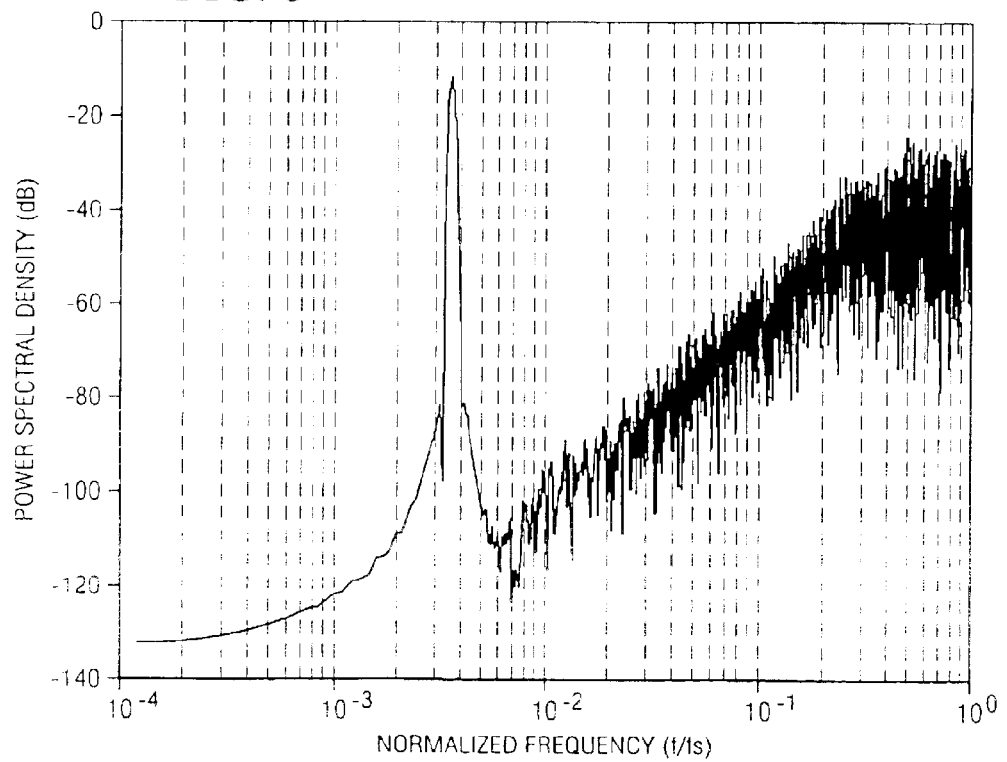
FIG. 8 is a power spectrum density plot associated with the second order sigma-delta ADC shown in FIG. 5.

FIG. 7 is a power spectrum density plot associated with the conventional second order sigma-delta ADC 300; while FIG. 8 is a power spectrum density plot associated with the second order sigma-delta ADC 500.

In summary explanation, a higher order sigma-delta ADC based on a FIR filter has been shown to possess the same functionality as a conventional sigma-delta ADC in terms of noise and swings at the output of the analog integrators. The higher order sigma-delta ADC requires only one analog amplifier however, even though it has a higher order analog integration function.

There are many architectures for implementing sigma-delta ADCs. Basically these architectures can be categorized as single path and multi-path architectures. All of these known architectures follow the basic rule regarding the number of amplifiers and the order of sigma-delta ADC discussed herein before. The FIR architecture described herein before can be used with any application if a sigma-delta ADC exists. Furthermore, power consumption and silicon area can be reduced dramatically since most power consuming building block is analog parts.

In view of the above, it can be seen the present invention presents a significant advancement in the art of sigma-delta ADCs. Further, this invention has been described in considerable detail in order to provide those skilled in the sigma-delta ADC filter art with the information needed to apply the novel principles and to construct and use such specialized components as are required.

Further, it should be apparent that while the present invention represents a significant departure from the prior art in construction and operation, only particular embodiments have been described in detail herein. It shall therefore be understood that various alterations, modifications and substitutions can be made therein without departing in any way from the spirit and scope of the present invention, as defined in the claims which follow.

What is claimed is:

1. A sigma-delta analog-to-digital converter (ADC) comprising:

an infinite impulse response (IIR) filter having no more than one analog amplifier and further having an order greater than one and operational to generate a plurality of output signals;

a digital filter operational to filter out up-converted frequency quantization noise associated with at least one IIR filter output signal and generate a low frequency feedback signal therefrom; and no more than one summing node, wherein the single summing node operates to sum the plurality of output signals and the low frequency feedback signal;

wherein the IIR filter further comprises a plurality of delay elements operational to cause the IIR filter to have an order greater than two.

2. A sigma-delta analog-to-digital converter (ADC) comprising:

an infinite impulse response (IIR) filter having no more than one analog amplifier and further having an order greater than one and operational to generate a plurality of output signals;

a digital filter operational to filter out up-converted frequency quantization noise associated with at least one IIR filter output signal and generate a low frequency feedback signal therefrom; and no more than one summing node, wherein the single summing node operates to sum the plurality of output signals and the low frequency feedback signal;

wherein the IIR filter is based on a finite impulse response (FIR) architecture.

3. A sigma-delta analog-to-digital converter (ADC) comprising:

an infinite impulse response (IIR) filter having no more than one analog amplifier and further having an order greater than one and operational to generate a plurality of output signals;

a digital filter operational to filter out up-converted frequency quantization noise associated with at least one IIR filter output signal and generate a low frequency feedback signal therefrom; and no more than one summing node, wherein the signal summing node operates to sum the plurality of output signals and the low frequency feedback signal;

further comprising means for compressing the low frequency quantization noise and pushing the compressed low frequency quantization noise into a higher frequency range to generate the up-converted frequency quantization noise.

4. A sigma-delta analog-to-digital converter (ADC) comprising:

an infinite impulse response (IIR) filter having no more than one analog amplifier and further having an order greater than one and operational to generate a plurality of output signals;

a digital filter operational to filter out up-converted frequency quantization noise associated with at least one IIR filter output signal and generate a low frequency feedback signal therefrom; and no more than one summing node, wherein the single summing node operates to sum the plurality of output signals and the low frequency feedback signal;

wherein the IIR filter further comprises a plurality of switched capacitors.

5. A method of analog-to-digital conversion, the method comprising the steps of:

providing a sigma-delta analog-to-digital converter (ADC) having no less than a second order infinite impulse response (IIR) filter and possessing no more than one analog amplifier; and converting an analog input signal to a digital signal to achieve a level of functionality substantially identical to a conventional sigma-delta ADC having more than one analog amplifier in terms of noise and swings at the output of the associated analog integrators;

wherein the IIR filter comprises an architecture that is based on a finite impulse response (FIR) filter architecture.

6. A method of analog-to-digital conversion, the method comprising the steps of:

providing a sigma-delta analog-to-digital converter (ADC) having no less than a second order infinite impulse response (IIR) filter and possessing no more than one analog amplifier; and converting an analog input signal to a digital signal to achieve a level of functionality substantially identical to a conventional sigma-delta ADC having more than one analog amplifier in terms of noise and swings at the output of the associated analog integrators;

wherein the step of converting an analog input signal to a digital signal comprises the steps of:

compressing low frequency quantization noise;

pushing the compressed low frequency quantization noise into a higher frequency range; and digitally filtering out the higher frequency quantization noise.

7. A method of analog-to-digital conversion, the method comprising the steps of:

providing a sigma-delta analog-to-digital converter (ADC) having no less than a second order infinite impulse response (IIR) filter and possessing no more than one analog amplifier; and converting an analog input signal to a digital signal to achieve a level of functionality substantially identical to a conventional sigma-delta ADC having more than one analog amplifier in terms of noise and swings at the output of the associated analog integrators;

wherein the step of converting an analog input signal to a digital signal comprises the steps of:

up-converting frequency quantization noise associated with at least one IIR filter output signal;

digitally filtering the up-converted frequency quantization noise to remove any high frequency quantization noise and generating a low frequency feedback signal therefrom; and summing at one summing node, a plurality of output signals associated with the at least one IIR filter and the low frequency feedback signal.

* * * * *